(12) United States Patent
Nishiguchi et al.

(10) Patent No.: US 10,734,222 B2
(45) Date of Patent: Aug. 4, 2020

(54) SEMICONDUCTOR STACK

(71) Applicant: SUMITOMO ELECTRIC INDUSTRIES, LTD., Osaka (JP)

(72) Inventors: Taro Nishiguchi, Hyogo (JP); Yu Saitoh, Osaka (JP); Hirofumi Yamamoto, Hyogo (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/745,672

(22) Filed: Jan. 17, 2020

(65) Prior Publication Data

US 2020/0152457 A1    May 14, 2020

Related U.S. Application Data

(63) Continuation of application No. 16/512,608, filed on Jul. 16, 2019, now Pat. No. 10,580,647, which is a
(Continued)

(30) Foreign Application Priority Data

Oct. 13, 2015   (JP) ................. 2015-202024

(51) Int. Cl.
*H01L 31/0312*   (2006.01)
*H01L 21/02*   (2006.01)
(Continued)

(52) U.S. Cl.
CPC ........ *H01L 21/02529* (2013.01); *C03B 25/02* (2013.01); *C30B 29/00* (2013.01); *H01L 21/022* (2013.01); *H01L 21/02008* (2013.01); *H01L 21/02378* (2013.01); *H01L 21/02433* (2013.01); *H01L 21/02609* (2013.01); *H01L 21/02614* (2013.01); *H01L 21/0445* (2013.01); *H01L 21/205* (2013.01); *H01L 21/30604* (2013.01); *H01L 21/31111* (2013.01); *H01L 21/02236* (2013.01); *H01L 21/02255* (2013.01)

(58) Field of Classification Search
CPC ......... H01L 21/02529; H01L 21/02164; H01L 21/02378; H01L 21/02433; H01L 21/02614; H01L 21/205
USPC ........................................................ 257/77
See application file for complete search history.

(56) References Cited

U.S. PATENT DOCUMENTS

| 6,660,084 B1 | 12/2003 | Shiomi et al. |
| 6,734,461 B1 | 5/2004 | Shiomi et al. |
| 2007/0221119 A1 | 9/2007 | Kimoto et al. |

FOREIGN PATENT DOCUMENTS

| JP | H9-27489 | 1/1997 |
| JP | 2003-332562 | 11/2003 |

(Continued)

*Primary Examiner* — David S Blum
(74) *Attorney, Agent, or Firm* — IPUSA, PLLC

(57) ABSTRACT

A semiconductor stack includes a substrate made of silicon carbide, and an epi layer disposed on the substrate and made of silicon carbide. An epi principal surface, which is a principal surface opposite to the substrate, of the epi layer is a carbon surface having an off angle of 4° or smaller relative to a c-plane. In the epi principal surface, a plurality of first recessed portions having a rectangular circumferential shape in a planar view is formed. Density of a second recessed portion that is formed in the first recessed portions and is a recessed portion deeper than the first recessed portions is lower than or equal to 10 $cm^{-2}$ in the epi principal surface.

12 Claims, 3 Drawing Sheets

Related U.S. Application Data continuation of application No. 15/758,805, filed as application No. PCT/JP2016/073603 on Aug. 10, 2016, now Pat. No. 10,395,924.

(51) Int. Cl.
*H01L 21/205* (2006.01)
*H01L 21/04* (2006.01)
*C03B 25/02* (2006.01)
*H01L 21/306* (2006.01)
*C30B 29/00* (2006.01)
*H01L 21/311* (2006.01)

(56) References Cited

FOREIGN PATENT DOCUMENTS

| | | |
|---|---|---|
| JP | 2003-332563 | 11/2003 |
| JP | 2005-286038 | 10/2005 |
| JP | 2006-328455 | 12/2006 |
| JP | 2014-38899 | 2/2014 |
| WO | 01/18286 | 3/2001 |

US 10,734,222 B2

SEMICONDUCTOR STACK

CROSS-REFERENCE TO RELATED APPLICATIONS

The present application is a continuation of U.S. patent application Ser. No. 16/512,608, now U.S. Pat. No. 10,580,647, filed on Jul. 16, 2019, which is a continuation of U.S. patent application Ser. No. 15/758,805, now U.S. Pat. No. 10,395,924, filed on Mar. 9, 2018, which is the National Stage of International Application NO. PCT/JP2016/073603 filed on Aug. 10, 2016, which is based on and claims priority to Japanese Patent Application No. 2015-202024 filed on Oct. 13, 2015, the entire contents of which are herein incorporated by reference.

TECHNICAL FIELD

The present invention relates to a semiconductor stack.

BACKGROUND ART

In Patent Document 1, when adopting an electrode made of a specific material to a SiC semiconductor device, measures for improving reliability of operation by improving reliability of an insulating film are proposed. Patent Document 1: Japanese Laid-Open Patent Application Publication No. 2014-38899

SUMMARY OF THE INVENTION

A semiconductor stack according to the present disclosure includes a substrate made of silicon carbide, and an epi layer disposed on the substrate and made of silicon carbide. A principal surface, which is a principal surface opposite to the substrate, of the epi layer is a carbon surface having an off angle of 4° or smaller relative to a c-plane. A plurality of first recessed portions having an outer shape of a rectangular shape in a planar view is formed in the epi principal surface. Density of a second recessed portion that is formed in the first recesses and is a recess deeper than the first recessed portions is lower than or equal to $10\ cm^{-2}$ in the epi principal surface.

MODE OF CARRYING OUT THE INVENTION

Figure 1:
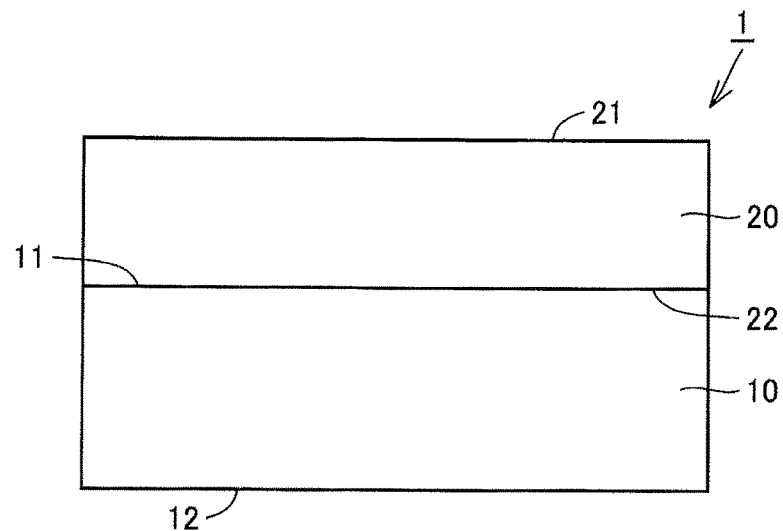
FIG. 1 is a schematic cross-sectional view illustrating an example of a structure of a semiconductor stack.

Description of Embodiments of the Present Invention

To begin with, embodiments of the present invention are listed and described below. A semiconductor stack of the present application includes a substrate made of silicon carbide, and an epi layer (epitaxial layer) that is disposed on the substrate and is made of silicon carbide. An epi principal surface (epitaxial layer principal surface), which is a principal surface opposite to the substrate, of the epi layer is a carbide surface having an off angle of 4° or smaller relative to a c-plane. A plurality of first recessed portions having an outer shape of a rectangular shape when seen in a plan view (in a planar view) is formed in the epi principal surface. Density of a second recessed portion that is formed in the first recessed portions and is a recessed portion deeper than the first recessed portions is lower than or equal to $10\ cm^{-2}$ in the epi principal surface.

In a semiconductor device that includes an epi layer as an operational layer, there may be a problem with reliability of the operation. The inventors investigated the cause and acquired the following findings. When manufacturing a SiC semiconductor device using a semiconductor stack including a substrate made of semiconductor carbide and an epi layer formed on the substrate and made of semiconductor carbide, an electrode constituted of an insulating film made of carbide dioxide and a conductor made of metal is formed on the epi layer. According to the investigation of the inventors, a plurality of first recessed portions having an outer shape of a rectangular shape when seen in a plan view is formed in a principal surface of an epi layer that is a carbon surface having an off angle of 4° or smaller relative to a c-plane ({0001} plane) of a silicon carbide crystal constituting the epi layer. In the first recessed portions, there may be a second recessed portion that is a recessed portion deeper than the first recessed portions. When manufacturing a semiconductor device by forming an oxide film (e.g., gate oxide film of a MOSFET (Metal Oxide Semiconductor Field Effect Transistor)) that is an insulating film on the epi principal surface in a state of including many second recessed portions, electronic field concentration occurs caused by variations of the thickness of the oxide film, and the reliability of the oxide film decreases. As a result, the presence of the second recessed portion decreases the reliability of the operation of the SiC semiconductor device. In response to this, by decreasing the density of the second recessed portion in the epi principal surface, more specifically, to $10\ cm^{-2}$ or lower, the decrease in reliability of the operation can be inhibited.

In the semiconductor stack of the present application, the density of the second recessed portion in the epi principal surface is made $10\ cm^{-2}$ or lower. As a result, according to the semiconductor stack of the present application, a semiconductor stack that can improve the reliability of the operation of the SiC semiconductor device can be provided.

On this occasion, of the {0001} plane (c-plane) of hexagonal silicon carbide, a surface in which silicon atoms are arranged in the outermost surface is defined as a silicon surface, and a surface in which carbon atoms are arranged in the outermost surface is defined as a carbide surface. In the present application, a state in which the epi principal surface is the carbon surface having the off angle of 4° or smaller relative to the c-plane, means a state in which the epi principal surface is a surface constituted of a crystal surface principally made of the carbon surface and an angle formed between the epi principal surface and the {0001} plane is 4° or smaller.

In the above-mentioned semiconductor stack, the first recessed portions may be connected to a threading dislocation that penetrates through the epi layer in its thickness direction. By decreasing the second recessed portion formed in such first recessed portions, the reliability of the operation of the SiC semiconductor device can be improved.

In the above-mentioned semiconductor stack, the density of the second recessed portion may exceed 0 cm$^{-2}$ in the principal surface. By allowing the density of the second recessed portion to exceed 0 cm$^{-2}$ depending on a depth of the second recessed portion, variations of the film thickness of the epi layer can be inhibited.

In the above-mentioned semiconductor stack, depths of the first recessed portions may be 1 nm or shallower. The depth of the second recessed portion may be 10 nm or deeper. By decreasing the second recessed portion having the depth of 10 nm or deeper and formed in the first recessed portions having the depth of 1 nm or shallower, the reliability of the operation of the SiC semiconductor device can be improved.

In the above-mentioned semiconductor stack, the second recessed portion may have a depth of 2 nm or deeper. By decreasing the second recessed portion having the depth of 2 nm or deeper, the reliability of the operation of the SiC semiconductor device can be further improved.

In the above-mentioned semiconductor stack, the density of the second recessed portion may be 1 cm$^{-2}$ or lower. By decreasing the density of the second recessed portion to 1 cm$^{-2}$ or lower, the reliability of the operation of the SiC semiconductor device can be further improved.

In the above-mentioned semiconductor stack, the substrate may have a diameter of 100 mm or greater. By doing this, manufacture of the SiC semiconductor device using the semiconductor stack can be efficiently performed. From a point of view of further improving the efficiency of manufacturing the SiC semiconductor device, the diameter of the substrate may be 150 mm or greater.

Here, the density of the second recessed portion in the epi principal surface can be measured below, for example. The entire epi principal surface is measured by using SICA 6X produced by Lasertech Corporation and setting a magnification of an objective lens at 10-fold magnification. On this occasion, by setting a threshold of the depth such that only a recessed portion (i.e., second recessed portion) present in the epi principal surface and having a region deeper than the depth of the first recessed portions (e.g., 1 nm or shallower) is detected (e.g., the threshold is set such that only a recessed portion having a region of a depth of 10 nm or deeper is detected), and by measuring only a recessed portion having an outer shape of a rectangular shape in a planar view, the density of the first recessed portion inside which the second recessed portion is formed, that is, the density of the second recessed portion can be calculated. The density of the second recessed portion in the epi principal surface calculated in this manner is lower than or equal to 10 cm$^{-2}$, preferably lower than or equal to 1 cm$^{-2}$, and more preferably lower than or equal to 0.5 cm$^{-2}$ in the semiconductor stack of the present application.

Details of Embodiments of the Present Invention

Next, an embodiment of a semiconductor stack of the present invention is described below with reference to the accompanying drawings. It is to be noted that, in the explanation of the drawings, the same or corresponding components are given the same reference numerals, and explanations are not repeated.

The semiconductor stack in the present embodiment is described below with reference to FIG. 1. An epi substrate 1 that is a semiconductor stack includes a substrate 10 and an epi layer 20. The substrate 10 and the epi layer 20 are made of silicon carbide (SiC). More specifically, the substrate 10 and the epi layer 20 are made of hexagonal SiC, for example, 4H—SiC. The substrate 10 has a first principal surface 11, and a second principal surface 12. An angle formed between a c-plane ({0001} plane) of SiC constituting the substrate 10, and the first principal surface 11 and the second principal plane 12, is 4° or lower. The first principal surface 11 is a carbon surface. The second principal surface 12 is a silicon surface.

The epi layer 20 has a first principal surface 21 and a second principal surface 22. The first principal surface 21 is an epi principal surface of the epi substrate 1. The epi layer 20 is arranged to contact with the first principal surface 11 of the substrate 10 at the second principal surface 22. The epi layer 20 is a SiC layer formed by epitaxial growth on the first principal surface 11 of the substrate 10. That is, the epi layer 20 is a SiC layer that has inherited a crystal structure from the substrate 10. The first principal surface 21, which is a principal surface opposite to the substrate 10, of the epi layer 20, is a carbon surface that has an off angle of 4° of lower relative to the c-plane.

Figure 2:
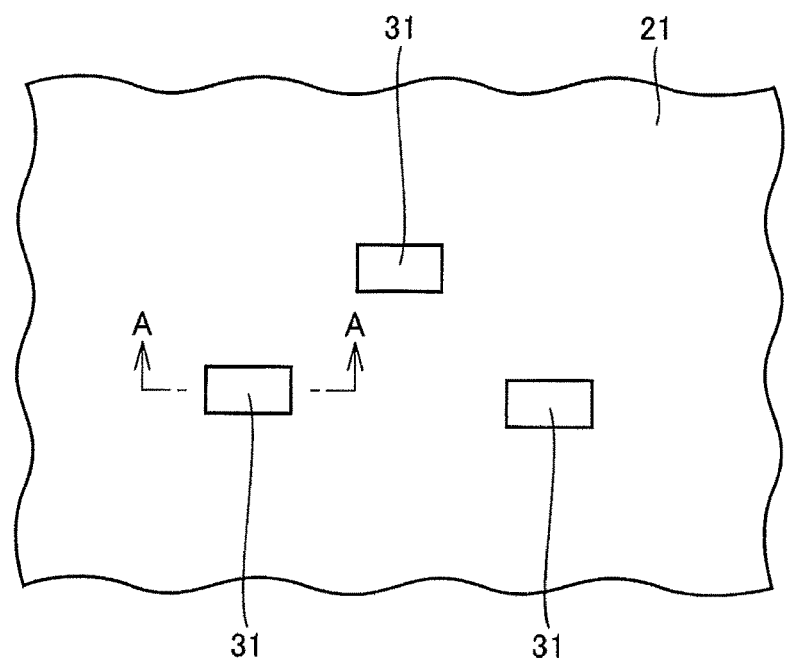
FIG. 2 is a schematic plan view illustrating a state of an epi principal surface.
Figure 3:
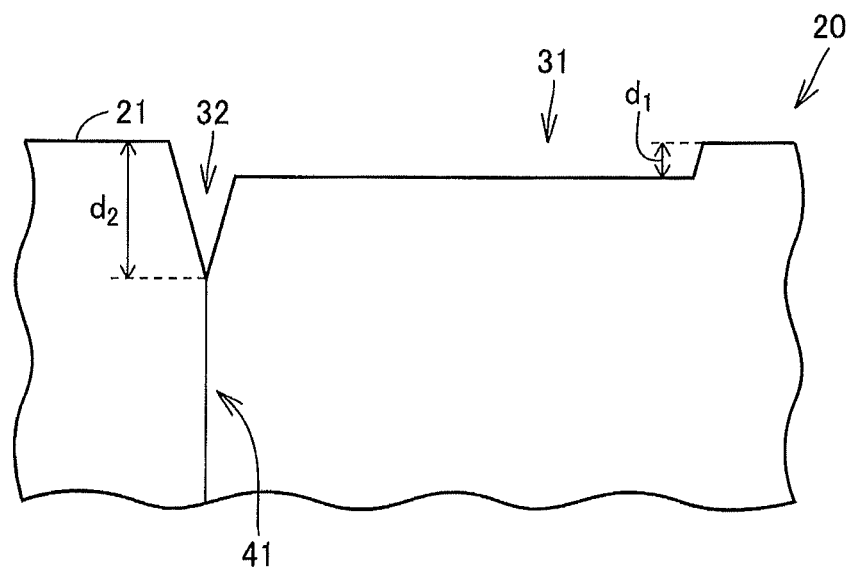
FIG. 3 is a schematic cross-sectional view illustrating an example of a cross section taken along an A-A line segment of FIG. 2.
Figure 4:
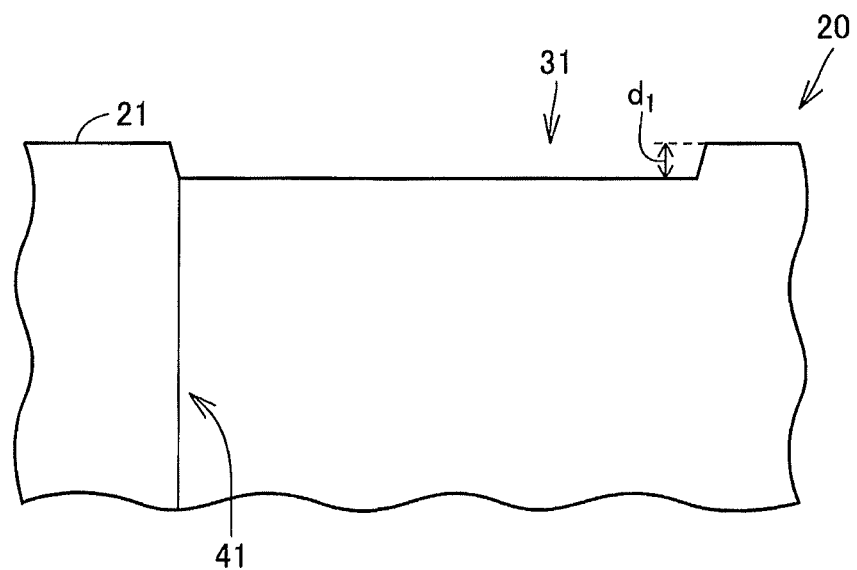
FIG. 4 is a schematic cross-sectional view illustrating an example of a cross section taken along the A-A line segment of FIG. 2.

FIG. 2 is a plan view showing the first principal surface 21 when seen from a position apart from the first principal surface 21 in a thickness direction of the epi layer 20. FIGS. 3 and 4 are schematic cross-sectional views illustrating examples of cross sections taken along a segment line A-A. With reference to FIG. 2, a plurality of first recessed portions 31 having an outer shape of a rectangular shape in a planar view is formed in the first principal surface 21 that is the epi principal surface. With reference to FIG. 3, a second recessed portion 32 that is a recessed portion deeper than the first recessed portions 31 may be formed in the first recessed portions 31. The depth $d_2$ of the second recessed portion 32 from the first principal surface 21 is deeper than the depth $d_1$ of the first recessed portions 31 from the first principal surface 21. In the epi substrate 1 of the present embodiment, the density of the second recessed portion 32 is lower than or equal to 10 cm$^{-2}$ in the first principal surface 21. In the epi substrate 1 of the present embodiment, the rate of the first recessed portions 31 in which the second recessed portion is not formed as illustrated in FIG. 4 is greater than the first recessed portions 31 in which the second recessed portion 32 is formed as illustrated in FIG. 3.

The density of the second recessed portion 32 that decreases the reliability of the operation of the SiC semiconductor device is decreased to 10 cm$^{-2}$ or lower, which allows the epi substrate 1 in the present embodiment to be a semiconductor stack that can improve the reliability of the operation of the SiC semiconductor device.

With reference to FIGS. 2 and 3, the second recessed portion 32 is formed so as to contact a short side on one side of the first recessed portion 31 having a rectangular shape. With reference to FIGS. 3 and 4, the first recessed portion 31 is connected to the threading dislocation 41 that penetrates through the epi layer in the thickness direction. Described from another point of view, the first recessed portion 31 is formed to correspond one-to-one with the threading dislocation 41. With reference to FIG. 3, when the second recessed portion 32 is formed in the first recessed portion 31, the threading dislocation 41 is connected to the bottom of the second recessed portion 32. With reference to FIG. 4, when the second recessed portion 32 is not formed in the first recessed portion 31, the threading dislocation 41 is connected to the bottom of the first recessed portion 31 having the rectangular shape. In any case, the threading dislocation 41 is connected to a region adjacent to the short side on one side of the first recessed portion 31 having the rectangular shape.

Here, the threading dislocation 41 is a linear defect that is generated by a displacement of a lattice plane. The threading dislocation 41 includes two types of dislocations of a threading edge dislocation and a threading screw dislocation. The threading edge dislocation is a crystal defect in which a burgers vector indicating a displacement direction of the crystal and a displacement line are normal to each other. The crystal defect of the threading edge dislocation has a shape that includes a single surplus atomic-plane that goes into a complete crystal plane in a blade-like manner, and its dislocation line penetrates through the c-plane. In the meantime, the screw dislocation is a crystal defect that has a dislocation line parallel to a burgers vector, and an atomic plane spirals around the dislocation line. The dislocation line penetrates through the c-plane similar to the threading edge dislocation. Moreover, the threading screw dislocation having a great burgers vector becomes a micro pipe that forms a pipe-shaped hole.

Usually, the silicon carbide substrate contains the above-mentioned two types of defects (the threading edge dislocation and the threading screw dislocation), and the substrate 10 of the epi substrate 1 according to the present embodiment also contains the above-mentioned two types of the defects. For example, with respect to the threading dislocation density present in the substrate 10, the density of the threading edge dislocation is 2000 $cm^{-2}$ or lower; the density of the threading screw dislocation is in a range of 500 to 1000 $cm^{-2}$; and the density of the micro pipe is 1 $cm^{-2}$ or lower. Because these threading dislocations propagate to the epi layer 20, a considerable number of the threading dislocations 41 are formed in the epi layer 20. The depth of the second recessed portion 32 varies depending on the type of the threading dislocation. The depth of the second recessed portion 32 becomes deeper in order of the threading edge dislocation< the threading screw dislocation< the micro pipe. In other words, when the threading edge dislocation is compared to the threading screw dislocation, the second recessed portion 32 in which the threading screw dislocation is formed becomes deeper. Moreover, when the micro pipe that has a great burgers vector among the threading screw dislocation is formed, the depth of the second recessed portion 32 becomes further deeper.

Thus, a variety of depth of the second recessed portions 32 is formed in the epi layer 20 depending on the type of the formed threading dislocation 41.

In the epi substrate 1 of the present embodiment, the depth $d_1$ of the first recessed portion 31 is shallower than or equal to 1 nm. Furthermore, the depth $d_2$ of the second recessed portion 32 is deeper than or equal to 10 nm. By decreasing the density of the second recessed portion 32 having a depth of 10 nm or deeper formed in the first recessed portion 31 having a depth of 1 nm or shallower to 10 $cm^{-2}$ or lower, the reliability of the operation of the SiC semiconductor device can be improved.

Furthermore, the density of the second recessed portion 32 having a depth of 2 nm or deeper is preferably decreased to 10 $cm^{-2}$ or lower. Thus, the reliability of the operation of the SiC semiconductor device can be further improved.

In addition, in the epi substrate 1, the density of the second recessed portion 32 is made preferably 1 $cm^{-2}$ or lower in the first principal surface 21. By decreasing the density of the second recessed portion 32 having a depth of 10 nm or deeper, or further a depth of 2 nm or deeper to 1 $cm^{-2}$ or lower, the reliability of the operation of the SiC semiconductor device can be further improved.

Moreover, a diameter of the substrate 10 is preferably greater than or equal to 100 mm, and also preferably greater than or equal to 150 mm. By doing this, the manufacture of the SiC semiconductor device using the epi substrate 1 can be efficiently performed.

Figure 5:
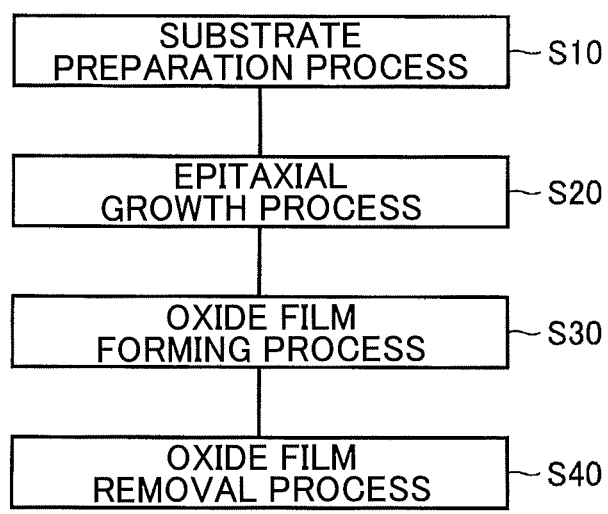
FIG. 5 is a flowchart illustrating a schematic method for manufacturing a semiconductor stack.

Next, an example of a method for manufacturing the epi substrate 1 according to the embodiment is described below. With reference to FIG. 5, in the method for manufacturing the epi substrate 1 according to the embodiment, a substrate preparation process is performed at first as a process (S10). In this process (S10), with reference to FIG. 1, for example, an ingot made of 4H—SiC containing an n-type impurity at a desired concentration is sliced. After that, a substrate 10 is prepared via processes such as a surface planarization process and a cleaning process. A first principal surface 11 is a carbon surface having an off angle of 4° or smaller relative to a c-plane.

Subsequently, an epitaxial growth process is performed as a process (S20). In this process (S20), with reference to FIG. 1, an epi layer 20 made of silicon carbide is formed on the first principal surface 11 of the substrate 10 prepared in the process (S10) by epitaxial growth. The epi layer 20 is formed so as to contain, for example, a desired concentration of an n-type impurity. More specifically, by supplying a source gas of silicon carbide and the n-type impurity into a furnace while heating the substrate 10 prepared in the process (S10) to a proper temperature in the furnace, the epi layer 20 is formed. Thus, a structure in which the epi layer 20 is formed on the substrate 10 can be obtained.

On this occasion, according to the inventor's investigation, as illustrated in FIG. 3, a plurality of first recessed portions 31 having an outer shape of a rectangular shape in a planar view is formed in the first principal surface 21 of the epi layer 20 that is the carbon surface having the off angle of 4° or smaller relative to the c-plane. Moreover, in the first recessed portions 31, a second recessed portion 32 that is a recess deeper than the first recessed portion is formed. The depth $d_1$ of the first recessed portion 31 is, for example, 1 nm or shallower. Furthermore, a length of a long side of the first recessed portion 31 having the outer shape of the rectangular shape in a planar view is, for example, longer than or equal to 20 μm and shorter than or equal to 30 μm.

Next, an oxide film forming process is performed as a process (S30). In the process (S30), the structure obtained in the process (S20) is, for example, thermally oxidized. Thus, an oxide film is formed to cover the first principal surface 21 of the epi layer 20.

Subsequently, an oxide film removal process is performed as a process (S40). In this process (S40), the oxide film formed in the process (S30) is removed, for example, by hydrofluoric acid. Here, according to the inventor's investigation, by performing the process (S40) after performing the process (S30) in appropriate conditions considering conditions of the process (S20), the density of the second recessed portion 32 can be effectively decreased.

The depth $d_2$ of the second recessed portion 32 depends on growth conditions of the epi layer 20 in the process (S20). Then, in order to effectively decrease the density of the second recessed portion 32 by the removal of the oxide film in the process (S40), the thickness of the oxide film and a forming speed of the oxide film in the process (S30) are important. More specifically, to begin with, a sufficiently thick oxide film needs to be formed in the process (S30) relative to the depth $d_2$ of the second recessed portion 32 formed in the process (S20). For example, when the depth $d_2$ of the second recessed portion 32 is about 10 nm, the thickness of the oxide film that is formed to cover the first principal surface 21 of the epi layer 20 needs to be thicker than or equal to the depth $d_2$, that is, 10 nm or thicker. In the formation of the oxide film by thermal oxidation, because the oxide film is formed to cover even a region containing the second principal surface 12 of the substrate 10, the total thickness of the oxide film needs to be made double or more of the depth $d_2$, that is, 20 nm or thicker. In order to decrease the density of the second recessed portion 32 more reliably, the total thickness of the oxide film is preferably made triple or more of the depth $d_2$, that is, 30 nm or thicker.

Furthermore, in addition to the above-mentioned appropriate thickness condition of the oxide film, the forming speed of the oxide film is also important. According to the investigation of the inventors, when the forming speed of the oxide film is insufficient, even if the thickness condition of the oxide film is appropriate, the density of the second recessed portion 32 cannot be effectively decreased. The forming speed of the oxide film can be increased, for example, by increasing the temperature of the thermal oxidation.

Thus, by appropriately setting the thickness of the oxide film and the forming speed of the oxide film, the density of the second recessed portion 32 can be effectively decreased. In the first principal surface 21 of the epi layer 20, the rate of the first recessed portion 31 in which the second recessed portion 32 is not formed as illustrated in FIG. 4 becomes greater than the rate of the first recessed portion 31 in which the second recessed portion 32 is formed as illustrated in FIG. 3. As a result, the epi substrate 1 of the present embodiment in which the density of the second recessed portion 32 is decreased to 10 $cm^{-2}$ or lower can be manufactured.

Thus, in the epi substrate 1 of the present embodiment, the upper limit of the density of the second recessed portion 32 is made 10 $cm^{-2}$ or lower, but there is no lower limit, and ideally the lower limit is preferably 0 $cm^{-2}$. However, if the density of the second recessed portion 32 is tried to be made 0 $cm^{-2}$, the thickness of the oxide film needs to be determined while considering the maximum depth value of the second recessed portion 32, and the thickness of the oxide film needs to be made considerably thick in the above-mentioned process (S30). In other words, the total thickness of the oxide film can need to be made at least four times as thick as the depth $d_2$ of the second recessed portion 32 of 40 nm or thicker, or at least five times as thick as the depth $d_2$ of the second recessed portion 32 of 50 nm or thicker.

However, when the film thickness of the oxide film is made too thick, variations in film thickness are likely to occur. After that, because the oxide film is removed, the variations in the film thickness of the epi layer 20 are likely to occur in the end. As a result, when a device is formed in the epi substrate 1 later, variations in device quality are liable to occur. In other words, if the density of the second recessed portion 32 is tried to be made 0 $cm^{-2}$, side effects of variations in the film thickness of the epi layer 20 and further variations in the device quality are liable to occur. Hence, depending on the depth of the second recessed portion 32, that is, when the second recessed portion 32 is deep, the process of manufacturing the epi substrate 1 may be performed so that the density of the second recessed portion 32 exceeds 0 $cm^{-2}$. Thus, considering the density of the second recessed portion 32, when the depth of the second recessed portion 32 is considerably deep, the process conditions may be set to a process target such that the density of the second recessed portion 32 exceeds 0 $cm^{-2}$ from the beginning. Thus, the manufacturing process that causes the density of the second recessed portion 32 in the principal surface 21 to be reliably 10 $cm^{-2}$ or lower can be implemented.

An experiment for investigating conditions of thermal oxidation to decrease the density of the second recessed portion was performed. The procedure of the experiment is described below.

To begin with, the above-described processes (S10) and (S20) were performed under the same conditions, and three examples were produced. Next, the process (S30) was performed under different thermal oxidation conditions on the obtained samples. After that, the process (S40) was performed under the same conditions. Then, the presence of the second recessed portion 32 in the first principal surface 21 of the epi layer 20 that was the epi surface was checked by AFM. The acquired results are described below.

The depth of the second recessed portion 32 before performing the process (S30) was up to 20 nm. Then, in the process (S30), an oxide film having a total thickness (sum of the thickness of the epi layer 20 on the side of the first principal surface 21 and the thickness of the substrate 10 on the side of the second principal surface 12) of 60 nm under two temperature oxidation conditions of 1150° C. and 1350° C. After that, when the first principal surface 21 of the epi layer 20 was observed by the AFM after removing the oxide film using hydrofluoric acid (process (S40)), the presence of the second recessed portion 32 was not acknowledged. On the other hand, the process (S30) for forming an oxide film having a total thickness of 80 nm was performed on another sample under the condition of the oxidation temperature of 1050° C. Then, when the first principal surface 21 of the epi layer 20 was observed by the AFM after removing the oxide film using hydrofluoric acid (process (S40)), the presence of the second recessed portion 32 having a depth of about 4 nm was acknowledged.

From the above experimental results, in addition to the sufficient thickness of the oxide film formed in the process (S30), it can be said that it is also important to set the forming speed of the oxidation film (temperature of the thermal oxidation) at a sufficiently high speed. Then, it is acknowledged that the epi substrate 1 of the present embodiment in which the density of the second recessed portion 32 having a depth of 10 nm or deeper (or 2 nm or deeper) formed in the first recessed portion 31 having a depth of 1 nm or shallower is decreased to 10 $cm^{-2}$ or lower (or 1 $cm^{-2}$ or lower).

It is understood that the embodiments and working examples disclosed herein are illustrative and non-restrictive in any respect. The scope of the present invention is defined by the terms of the claims, rather than the embodiments described above, and is intended to include any modifications within the scope and meaning equivalent to the terms of the claims.

DESCRIPTION OF THE REFERENCE NUMERALS 1 epi substrate
10 substrate
11 first principal surface
12 second principal surface
20 epi layer
21 first principal surface
22 second principal surface
31 first recessed portion
32 second recessed portion
41 threading dislocation

The invention claimed is:

1. A semiconductor stack, comprising:
   a substrate made of silicon carbide having a diameter greater than or equal to 150 mm; and
   an epi layer disposed on the substrate and made of silicon carbide,
   wherein the substrate and the epi layer are composed of 4H—SiC,
   wherein an epi principal surface of the epi layer, the epi principal surface being a principal surface opposite to the substrate, is a carbon surface having an off angle of 4° or smaller relative to a c-plane,
   wherein a plurality of first recessed portions having an outer shape of a rectangular shape in a planar view is formed in the epi principal surface, and
   wherein density of a second recessed portion that is formed in the first recessed portions and is a recessed portion deeper than the first recessed portions, is lower than or equal to 10 $cm^{-2}$ in the epi principal surface.

2. The semiconductor stack as claimed in claim 1, wherein the first recessed portions are connected a threading dislocation that penetrates through the epi layer in a thickness direction.

3. The semiconductor stack as claimed in claim 1, wherein the density of the second recessed portion exceeds 0 $cm^{-2}$ in the epi principal surface.

4. The semiconductor stack as claimed in claim 2, wherein the density of the second recessed portion exceeds 0 $cm^{-2}$ in the epi principal surface.

5. The semiconductor stack as claimed in claim 3,
   wherein a depth of the first recessed portions is shallower than or equal to 1 nm, and
   wherein a depth of the second recessed portion is deeper than or equal to 10 nm.

6. The semiconductor stack as claimed in claim 5, wherein the depth of the second recessed portion is deeper than or equal to 2 nm.

7. The semiconductor stack as claimed in claim 1, wherein the density of the second recessed portion is lower than or equal to 1 $cm^{-2}$ in the epi principal surface.

8. A semiconductor stack, comprising:
   a substrate made of silicon carbide; and
   an epi layer disposed on the substrate and made of silicon carbide,
   wherein an epi principal surface of the epi layer, the epi principal surface being a principal surface opposite to the substrate, is a carbon surface having an off angle of 4° or smaller relative to a c-plane,
   wherein a plurality of first recessed portions having an outer shape of a rectangular shape in a planar view is formed in the epi principal surface,
   wherein the plurality of first recessed portions includes a multi-depth first recessed portion with a second recessed portion deeper than the first recessed portions, and a single-depth first recessed portion without the second recessed portion,
   wherein a proportion of the multi-depth first recessed portion with the second recessed portion is lower than a proportion of the single-depth first recessed portion without the second recessed portion with respect to the plurality of first recessed portions, and
   wherein density of the multi-depth first recessed portion with the second recessed portion is lower than or equal to 10 $cm^{-2}$ in the epi principal surface.

9. The semiconductor stack as claimed in claim 8, wherein the first recessed portions are connected a threading dislocation that penetrates through the epi layer in a thickness direction.

10. The semiconductor stack as claimed in claim 8, wherein the density of the multi-depth first recessed portion with the second recessed portion exceeds 0 $cm^{-2}$ in the epi principal surface.

11. The semiconductor stack as claimed in claim 8, wherein the density of the multi-depth first recessed portion with the second recessed portion is lower than or equal to 1 $cm^{-2}$ in the epi principal surface.

12. The semiconductor stack as claimed in claim 8,
   wherein a depth of the first recessed portions is shallower than or equal to 1 nm, and
   wherein a depth of the second recessed portion is deeper than or equal to 10 nm.

* * * * *